United States Patent [19]

Massoumi et al.

[11] Patent Number: 5,867,437
[45] Date of Patent: Feb. 2, 1999

[54] STATIC RANDOM ACCESS MEMORY WITH IMPROVED WRITE RECOVERY PROCEDURE

[75] Inventors: Ali Massoumi, Morgan Hill; Andalib Ahmed Chowdhury, Sunnyvale, both of Calif.

[73] Assignee: C-Cube Microsystems, Inc., Milpitas, Calif.

[21] Appl. No.: 882,518

[22] Filed: Jun. 25, 1997

[51] Int. Cl.⁶ ................................................ G11C 7/00
[52] U.S. Cl. ........................ 365/210; 365/203; 365/204
[58] Field of Search .................................. 365/210, 203, 365/204, 189.01

[56] References Cited

U.S. PATENT DOCUMENTS

| | | | |
|---|---|---|---|
| 4,658,382 | 4/1987 | Tran et al. | 365/203 |
| 5,083,047 | 1/1992 | Horie et al. | 365/203 |
| 5,229,968 | 7/1993 | Ito et al. | 365/210 |
| 5,703,820 | 12/1997 | Kohno | 365/203 |
| 5,745,421 | 4/1998 | Pham et al. | 365/203 |

*Primary Examiner*—Tan T. Nguyen
*Attorney, Agent, or Firm*—Fish & Richardson P.C.

[57] ABSTRACT

A method and apparatus for reading and writing data into a random access memory array having a dummy bit. The method includes the steps of providing a clock signal having two edges, one going from low to high and the other going from high to low. The edge going to high from low triggers an enable signal. The enable signal substantially simultaneously triggers a main wordline signal and a dummy wordline signal, the main wordline signal initiating a memory access process while the dummy wordline signal causes the generation of a dummy bit signal from the dummy bit, the combination of the main wordline signal and the dummy bit signal permitting memory access. The dummy bit signal shuts off the enable signal, which in turn causes the memory access process to be terminated and the memory array to go into a bit line precharging stage in preparation for a next read or write cycle, whereby bit line precharging may be commenced prior to the end of the clock cycle.

6 Claims, 2 Drawing Sheets

STATIC RANDOM ACCESS MEMORY WITH IMPROVED WRITE RECOVERY PROCEDURE

BACKGROUND AND FIELD OF THE INVENTION

In the design of static random access memories (SRAMs), one of the important problems that has limited the performance of the SRAM is the need to provide a proper timing sequence when a READ operation follows a WRITE operation. This has been called the "READ-after-WRITE" problem. A READ operation which follows a WRITE operation must be adequately delayed until the bit lines are precharged to their proper high level so that they subsequently can be discharged during the READ operation, as required. If the READ operation follows too quickly on the heels of a WRITE operation, the bitlines will not reach their correct precharge level. The necessity of guaranteeing that the READ does not occur prematurely often detracts from the overall performance of prior art SRAMs.

SUMMARY OF THE INVENTION

A method and apparatus have been invented to avoid the READ-after-WRITE problem without the insertion of unnecessary delays. The improved method of the invention allows reading and writing data into an SRAM by providing a clock signal having two edges, one going from low to high and the other from high to low. One edge of the clock signal, for example, the one going high from low, triggers an enable signal. The enable signal in turn substantially simultaneously triggers a main wordline signal and a dummy wordline signal. The main wordline signal initiates the normal memory access process used to READ data from or WRITE data into the memory array. The dummy wordline signal causes the generation of a dummy bit signal from a dummy bit contained in the array. The combination of the main wordline signal and the dummy bit signal permit memory access for either a READ or a WRITE operation.

When the dummy bit signal goes from high to low, the enable signal is shut off, which in turn terminates the memory access process and allows the array to go into a bit line precharging stage in preparation for the next READ or WRITE cycle. The sequence of this invention allows bit line precharging to commence prior to the end of the clock cycle.

DETAILED DESCRIPTION OF THE PREFERRED EMBODIMENT

Figure 1:
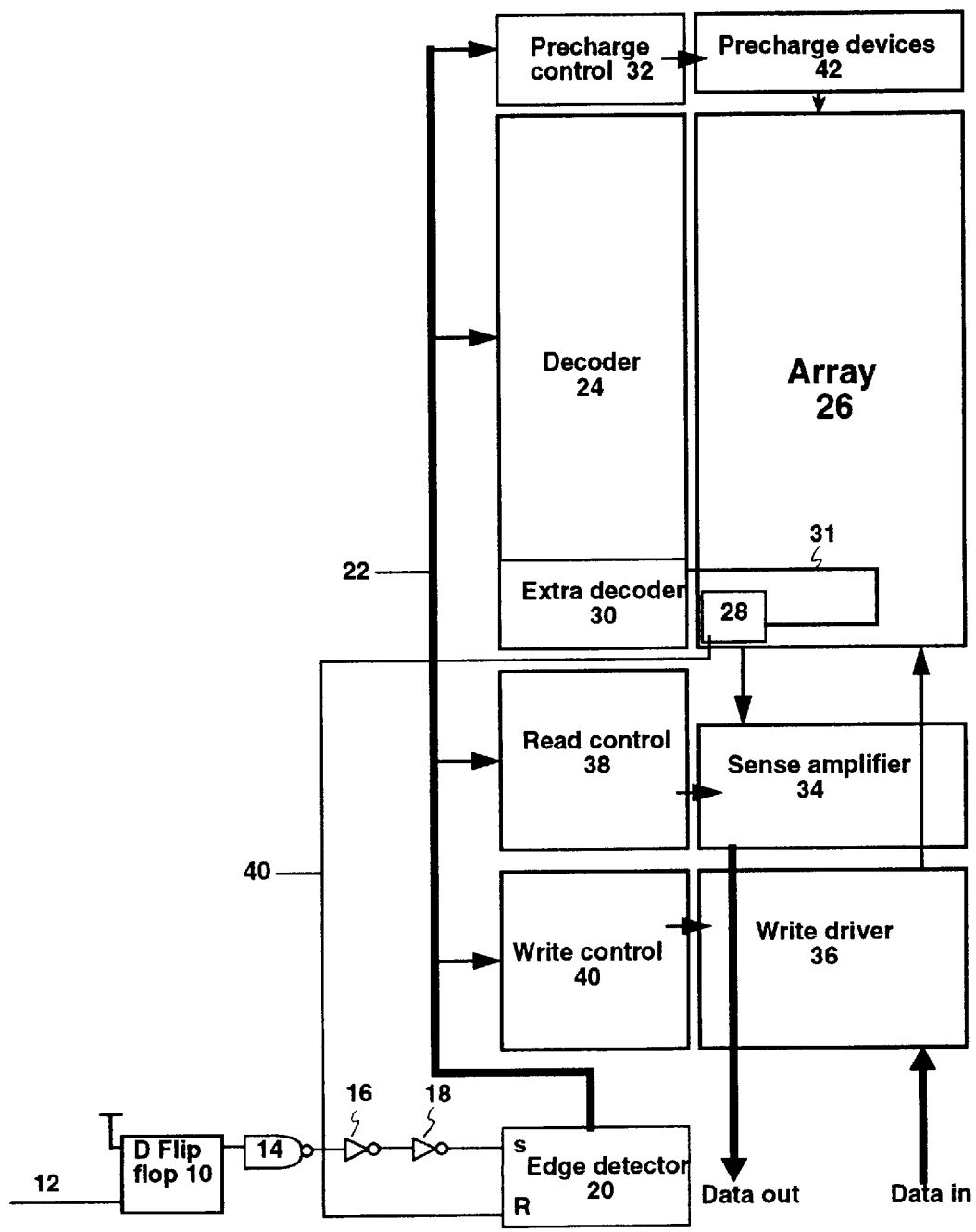
FIG. 1 is a block and partial schematic diagram of an SRAM circuit of the invention.
Figure 2:
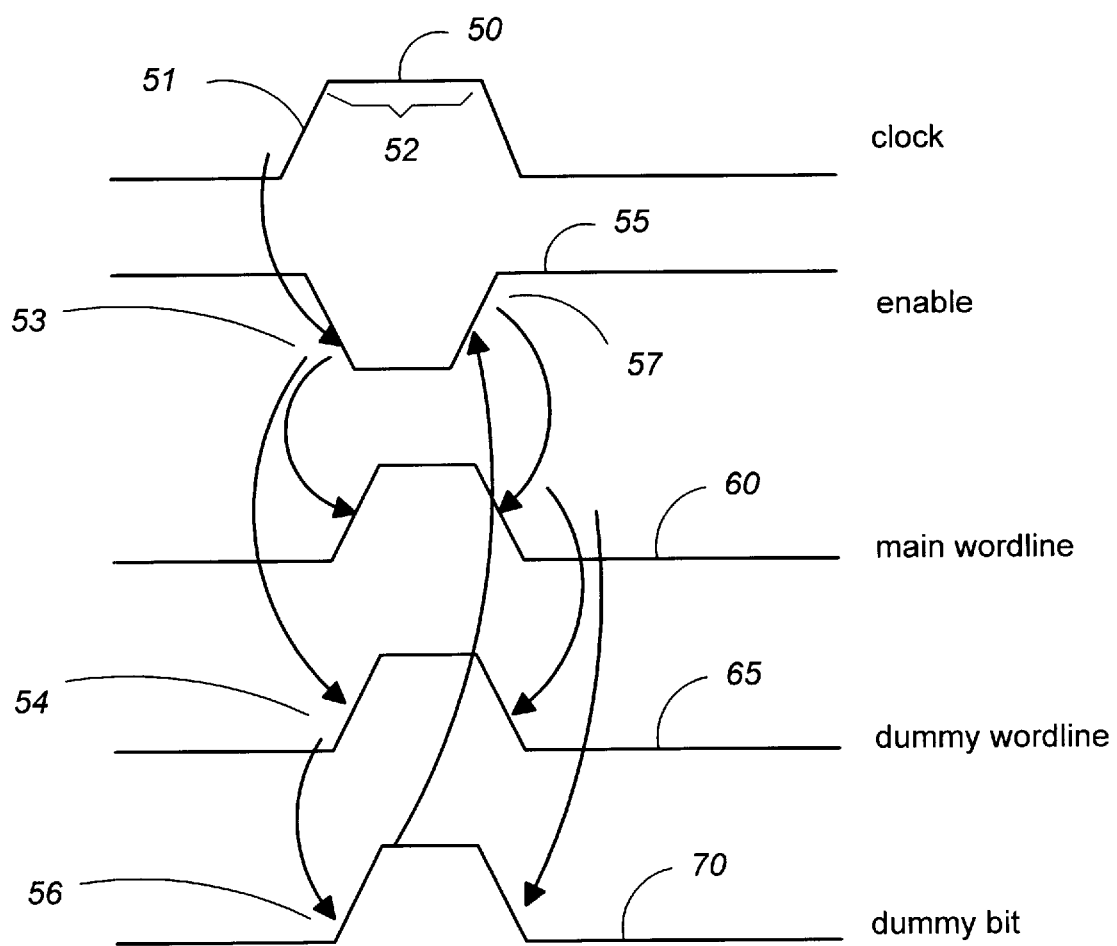
FIG. 2 is a timing diagram showing the timing of the operation of the circuit of FIG. 1 according to the invention.

This description will refer both to the block diagram of FIG. 1 and to the timing diagram of FIG. 2. In the timing diagram, the signals are going from left to right. In the operation of the SRAM of FIG. 1, a clock signal 50 is transmitted from clock 12 to one input of a flip-flop 10. The clock signal 50 then goes through a delay chain including NAND-gate 14 and two inverters 16 and 18, to arrive at the SET ("S") input of edge detector 20. In the preferred embodiment, the output signal 55 from edge detector 20 is triggered by edge 51 of clock signal 50 going from low to high. However, a high-to-low edge could be used by shifting the other signals by one-half clock cycle, as is known in the art. The output signal 55 from edge detector 20, which in the preferred embodiment illustrated is a negative pulse of opposite polarity to the clock signal 50, is called the "enable" signal 55. As shown in FIG. 1, enable signal 55 appears on line 22.

Leading edge 53 of enable signal 55 going from high to low causes several actions to take place. First, enable signal 55 on line 22 appears at an input to wordline decoder 24. The receipt of leading edge 53 of that signal by decoder 24 causes the correct wordline to be selected by decoder 24, according to the incoming memory address to the SRAM. Decoder 24 then provides a main wordline signal 60 through the selected wordline to the array 26.

Decoder 24 includes an extra decoder circuit 30. At the same time as the main wordline signal 60 is sent from decoder 24, triggered by the leading edge 53 of enable signal 55, this extra decoder 30 sends a dummy wordline signal 65 along dummy wordline 31 to dummy cell 28. This dummy cell 28 is added to the array 26 for the purposes of the invention, and is in addition to the normal SRAM cells in array 26. For example, in an 8 kilobit SRAM array, there are normally 8192 memory cells. Accordingly, in the array of this invention, 8193 cells are used, including dummy cell 28. Dummy cell 28 always stores a fixed bit, such as a 1, and its contents are never changed by any incoming data to the memory. Dummy cell 28 is connected to extra decoder 30 through dummy wordline 31.

The leading, low-to-high edge 54 of dummy wordline signal 65, which is passed along dummy wordline 31, generates a dummy bit signal 70 on line 40. Dummy bit signal 70 is sent over line 40 to the RESET ("R") input of edge detector 20. The leading, low-to-high edge 56 of dummy bit signal 70 resets edge detector 20, which shuts off signal 55 on line 22. The termination of the enable signal 55 on line 22 activates precharge control circuit 32 to terminate memory access. Precharge control circuit 32 then immediately causes the memory to go into its precharge state.

The leading low-to-high edge 56 of dummy bit signal 70 also enables either sense amplifier 34, in the case of a READ operation, or WRITE driver circuit 36, in the case of a WRITE operation. If a READ operation is requested, enable signal 55 on line 22 activates READ control circuit 38. If a WRITE operation is selected, enable signal 55 on line 22 activates WRITE control circuit 40 which, in turn, activates WRITE driver circuit 36. For a WRITE, when there also is a simultaneous dummy bit signal 70 on line 40, WRITE driver 36 then WRITES a bit into memory array 26. For a READ, when there also is a simultaneous dummy bit signal 70 on line 40, READ control circuit 38 turns on sense amplifier 34 for reading the selected data from array 26.

An essential aspect of the invention is that the trailing low-to-high edge 57 of enable signal 55 on line 22 turns on precharge control 32, which in turn activates precharge devices 42 to commence precharge of array 26 prior to the end of clock cycle 52. Trailing edge 57 of enable signal 55 also causes the main wordline signal 60, the dummy wordline signal 65 and the dummy bit signal 70 to go from high to low so they are reset for the next cycle.

As will be understood by those skilled in the art, many changes in the methods and apparatus described above may be made by the skilled practitioner without departing form the spirit and scope of the invention, which should be limited only as set forward in the claims which follow.

What is claimed is:

1. A method of reading and writing data into a random access memory array having a dummy bit, comprising the steps of:

a) providing a clock signal having two edges, one going from low to high and the other going from high to low, one of the edges triggering an enable signal;

b) using the enable signal to substantially simultaneously trigger a main wordline signal and a dummy wordline signal, the main wordline signal initiating a memory access process while the dummy wordline signal causes the generation of a dummy bit signal from the dummy bit, the combination of the main wordline signal and the dummy bit signal permitting memory access;

c) using the dummy bit signal to shut off the enable signal, which in turn causes the memory access process to be terminated and the memory array to go into a bit line precharging stage in preparation for a next read or write cycle, whereby bit line precharging may be commenced prior to the end of the clock cycle.

2. The method of claim 1 wherein the one of the edges triggering the enable signal is the high-to-low edge.

3. The method of claim 1 wherein the enable signal is opposite polarity from the clock signal.

4. Apparatus for reading and writing data into a random access memory array having a dummy bit comprising a clock generator which provides a clock signal having two edges, one going from low to high and the other going from high to low, one of the edges triggering an enable signal, the enable signal substantially simultaneously triggering a main wordline signal and a dummy wordline signal, the main wordline signal initiating a memory access process while the dummy wordline signal causes the generation of a dummy bit signal from the dummy bit, the combination of the main wordline signal and the dummy bit signal permitting memory access, the dummy bit signal shutting off the enable signal, which in turn causes the memory access process to be terminated and the memory array to go into a bit line precharging stage in preparation for a next read or write cycle, whereby bit line precharging may be commenced prior to the end of the clock cycle.

5. The apparatus of claim 4 wherein the one of the edges triggering the enable signal is the high-to-low edge.

6. The apparatus of claim 4 wherein the enable signal is opposite polarity from the clock signal.

* * * * *